United States Patent
Mitarashi

(10) Patent No.: US 9,350,292 B2
(45) Date of Patent: May 24, 2016

(54) OSCILLATION CIRCUIT, CURRENT GENERATION CIRCUIT, AND OSCILLATION METHOD

(71) Applicant: LAPIS SEMICONDUCTOR CO., LTD., Yokohama-Shi, Kanagawa (JP)

(72) Inventor: Mutsumi Mitarashi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/698,193

(22) Filed: Apr. 28, 2015

(65) Prior Publication Data

US 2015/0326179 A1 Nov. 12, 2015

(30) Foreign Application Priority Data

May 12, 2014 (JP) .................................. 2014-098864

(51) Int. Cl.
*H03B 5/04* (2006.01)

(52) U.S. Cl.
CPC ........................................ *H03B 5/04* (2013.01)

(58) Field of Classification Search
CPC ........................................................ H03B 5/04
USPC ..................................... 331/66, 176, 111, 143
See application file for complete search history.

(56) References Cited

U.S. PATENT DOCUMENTS

| 6,020,792 A | * | 2/2000 | Nolan | ..................... | H03K 3/011 331/111 |
| 7,598,822 B2 | * | 10/2009 | Rajagopal | ............ | H03K 3/0231 331/111 |

FOREIGN PATENT DOCUMENTS

| JP | 2008-252414 A | 3/2007 |
| JP | 2011-135349 A | 7/2011 |

* cited by examiner

*Primary Examiner* — Joseph Chang
(74) *Attorney, Agent, or Firm* — Volentine & Whitt, PLLC

(57) ABSTRACT

An oscillation circuit includes a first current source having dependency of current value/temperature exhibiting a first characteristic; a second current source having dependency of current value/temperature exhibiting a second characteristic; a first conversion section, input with a current from the first current source, that outputs a first current having a specific characteristic which is converted from the first characteristic; a second conversion section, input with a current from the second current source, that outputs a second current having a specific characteristic which is converted from the second characteristic; a subtraction section, input with the first and the second current, that outputs a difference current that is a difference between the first and the second current; and a clock generation section that generates a clock signal by alternately charging and discharging a first capacitor and a second capacitor based on the difference current.

14 Claims, 11 Drawing Sheets

OSCILLATION CIRCUIT, CURRENT GENERATION CIRCUIT, AND OSCILLATION METHOD

CROSS-REFERENCE TO RELATED APPLICATION

This application claims priority under 35 USC 119 from Japanese Patent Application No. 2014-098864, filed on May 12, 2014, the disclosure of which is incorporated by reference herein.

BACKGROUND OF THE INVENTION

1. Field of the Invention

The present invention is related to an oscillation circuit, a current generation circuit, and an oscillation method.

2. Description of the Related Art

The precision of the frequency of a clock output from an oscillation circuit is an example of an important parameter in oscillation circuit design. In order to increase the precision of the output clock frequency, sometimes a reduction in the temperature dependency of a reference current generation circuit employed within an oscillation circuit is demanded.

A known oscillation circuit employing a reference current generation circuit is described in paragraphs [0019] to [0036] and FIG. 1 of Japanese Patent Application Laid-Open (JP-A) No. 2008-252414. Specifically, an oscillation circuit 1 described in JP-A No. 2008-252414 is an oscillation circuit installed in a microcontroller, and includes: a reference resistor RE1 that generates a reference current; an operational amplifier AMP1 that supplies current to the reference resistor RE1; a reference voltage generation circuit 24 that determines a reference voltage applied to the reference resistor RE1; an integrated circuit 2 that defines an oscillation frequency based on bias potentials PB1, NB1 generated by the reference current and constant currents Ip, generated by the bias potentials PB1, NB1; and a setting resistor 25 that sets temperature dependency of the output voltage of the reference voltage generation circuit 24 so as to be the same temperature dependency as the temperature dependency of the reference resistor RE1. The oscillation circuit 1 of JP-A No. 2008-252414 purports to obtain an oscillation frequency with low temperature dependency based on the bias potentials that are temperature independent, and the constant current.

JP-A No. 2011-135349 describes another example in which an oscillation circuit employs a reference current generation circuit. In the reference current generation circuit of the oscillation circuit described in JP-A No. 2011-135349, a current with positive dependency on absolute temperature, and a current with negative dependency on absolute temperature are added together to generate a current that is substantially temperature independent (paragraphs [0052]-[0065], FIG. 8).

However, the reference current generation circuit 24 for generating a reference current described in JP-A No. 2008-252414 has a circuit configuration employing an operational amplifier, and therefore is difficult to operate at low voltages. Specifically, the reference voltage generation circuit 24 described in JP-A No. 2008-252414 employs a band gap circuit employing an operational amplifier as illustrated in FIG. 5 of JP-A No. 2008-252414.

Operational amplifiers are generally configured by at least three vertically stacked Metal Oxide Semiconductor Field Effect Transistors (MOSFET, also referred to as MOS transistors below) between the power source and GND (ground, earth). Accordingly, a power source voltage of 1.8V or greater is required for a MOS transistor with a threshold value voltage of 0.6V. Further, there are also i an increase in the number of elements and an increase in the layout surface area due to employing dedicated band gap circuits and plural operational amplifiers, as well as requiring a MOS transistor with high withstand voltage. Similar points apply in the reference current generation circuit described in JP-A No. 2011-135349.

SUMMARY OF THE INVENTION

The present invention provides an oscillation circuit, a current generation circuit, and an oscillation method that may suppress temperature dependency, that may operate at low voltage, and that may suppress an increase in layout surface area.

A first aspect of the present invention is an oscillation circuit including: a first current source having a dependency of current value on temperature exhibiting a first characteristic; a second current source having a dependency of current value on temperature exhibiting a second characteristic; a first conversion section that is input with a current from the first current source and that outputs a first current including a specific characteristic which is converted from the first characteristic; a second conversion section that is input with a current from the second current source and that outputs a second current including a specific characteristic which is converted from the second characteristic; a subtraction section that is input with the first current and the second current and that outputs a difference current that is a difference between the first current and the second current; and a clock generation section that generates a clock signal by alternately charging and discharging a first capacitor and a second capacitor based on the difference current.

A second aspect of the present invention is a current generation circuit including: a first current source having a dependency of current value on temperature exhibiting a first characteristic; a second current source having a dependency of current value on temperature exhibiting a second characteristic; a first conversion section that is input with a current from the first current source and that outputs a first current having a specific characteristic which is converted from the first characteristic; a second conversion section that is input with a current from the second current source and that outputs a second current having a specific characteristic which is converted from the second characteristic; and a subtraction section that is input with the first current and the second current and that outputs a difference current that is a difference between the first current and the second current.

A third aspect of the present invention is an oscillation method including: inputting to a first conversion section a current from a first current source having a dependency of current value on temperature exhibiting a first characteristic, and outputting from the first conversion section a first current having a specific characteristic that has been converted from the first characteristic; inputting to a second conversion section a current from a second current source having a dependency of current value on temperature exhibiting a second characteristic, and outputting from the second conversion section a second current having a specific characteristic that has been converted from the second characteristic; inputting the first current and the second current to a subtraction section and outputting from the subtraction section a difference current that is a difference between the first current and the second current; and generating a clock signal by alternately charging and discharging a first capacitor and a second capacitor based on the difference current.

According to the above aspects, the present invention may provide an oscillation circuit, a current generation circuit, and an oscillation method that may suppress temperature dependency, that may operate at low voltage and that may suppress an increase in layout surface area.

BRIEF DESCRIPTION OF THE DRAWINGS

Exemplary embodiments of the present invention will be described in detail based on the following figures, wherein.

DETAILED DESCRIPTION OF THE INVENTION

Detailed explanation follows regarding exemplary embodiments of the present invention, with reference to the drawings.

[First Exemplary Embodiment]

Figure 1:
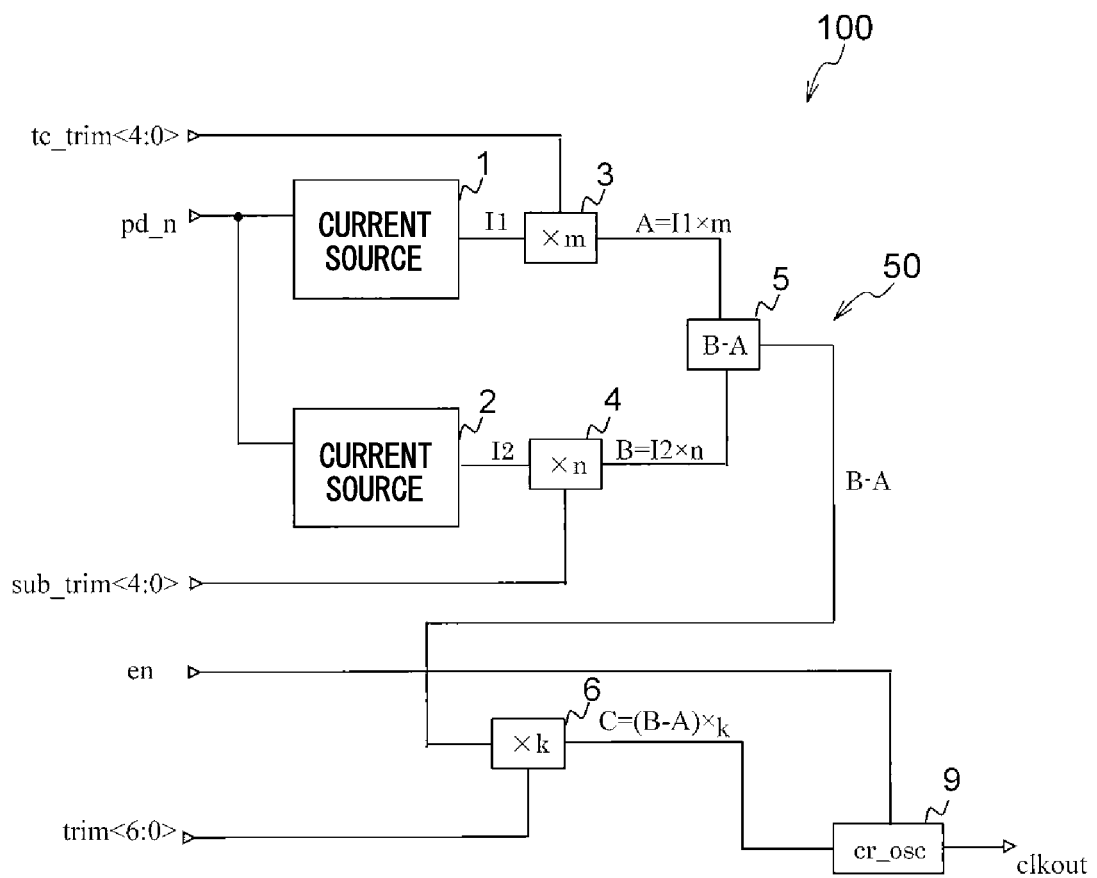
FIG. 1 is a functional block diagram illustrating an example of a functional configuration of an oscillation circuit according to a first exemplary embodiment.

Explanation follows regarding an oscillation circuit 100 and a current generating circuit 50 according to an exemplary embodiment, with reference to FIG. 1 to FIG. 7. FIG. 1 is a functional block diagram illustrating an oscillation circuit according to the present exemplary embodiment.

Figure 5:
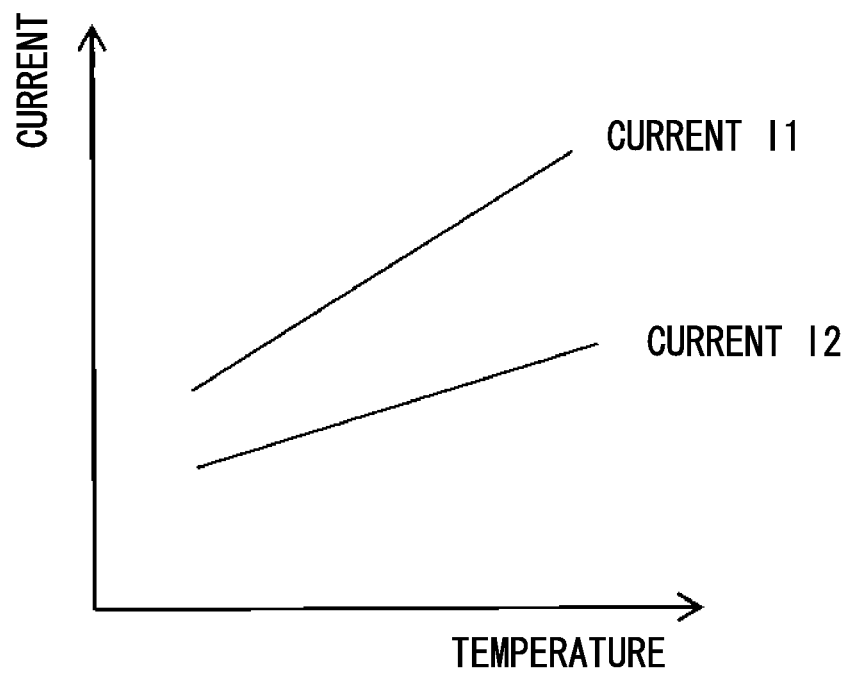
FIG. 5 is a graph to explain temperature dependency in a current source according to an exemplary embodiment.
Figure 6:
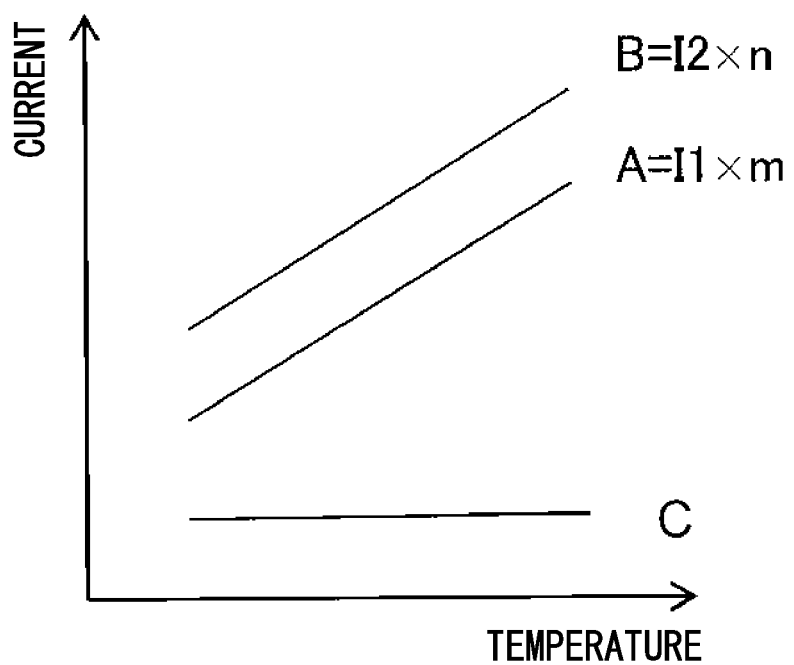
FIG. 6 is a graph to explain suppression of temperature dependency in a current source according to an exemplary embodiment.

FIG. 2 to FIG. 4, and FIG. 7, are specific circuit diagrams of a current source 1, a current source 2, a subtraction circuit 5, and a clock generation circuit 9 that are each illustrated in FIG. 1. FIG. 5 is a graph to explain temperature dependency in the current source 1 and the current source 2 according to the present exemplary embodiment, and FIG. 6 is a graph to explain suppression of temperature dependency in the current source 1 and the current source 2 according to the present exemplary embodiment.

As illustrated in FIG. 1, the oscillation circuit 100 according to the present exemplary embodiment is configured including the current source 1, the current source 2, trimming circuits 3, 4, 6 (respectively labelled ×m, ×n, and ×k in FIG.

1), the subtraction circuit 5 (labelled B-A in FIG. 1), and the clock generation circuit 9 (labelled cr_osc in FIG. 1).

In the oscillation circuit 100 according to the present exemplary embodiment, the current generating circuit 50 that generates a current with suppressed temperature dependency is configured including the current sources 1, 2, the trimming circuits 3, 4, and the subtraction circuit 5.

The current source 1 outputs a reference current I1, and the trimming circuit 3 generates a current A of m times the reference current I1 using a trimming signal tc_trim<4:0>. Note that the trimming signal tc_trim<4:0> means a 5 line (5 bit) selection signal that selects a current ratio of respective current mirror circuits connected to the trimming signals, and is configured, for example, such that H (high) level results in selection, and L (low) level results in non-selection.

Similarly, the current source 2 outputs a reference current I2, and the trimming circuit 4 generates a current B of n times the reference current I2 using a trimming signal sub_trim<4:0>.

The subtraction circuit 5 subtracts the current A from the current B to generate a current B-A.

The trimming circuit 6 generates a current C of k times the current B-A using a trimming signal trim<6:0>. The clock generation circuit 9 is an oscillation circuit that oscillates by alternately charging and discharging capacitors C0 and C1 (see FIG. 7) using the current B-A when an en signal (see FIG. 7) is H level. This oscillation creates a clock signal clkout.

Figure 2:
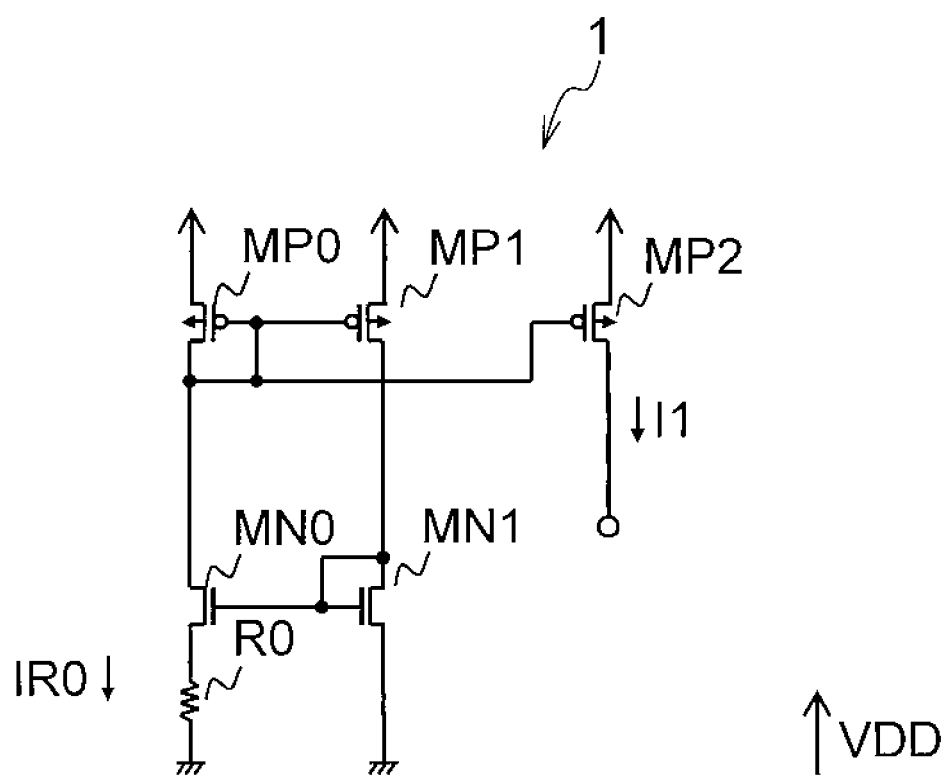
FIG. 2 is a circuit diagram illustrating an example of a configuration of a current source according to the first exemplary embodiment.
Figure 3:
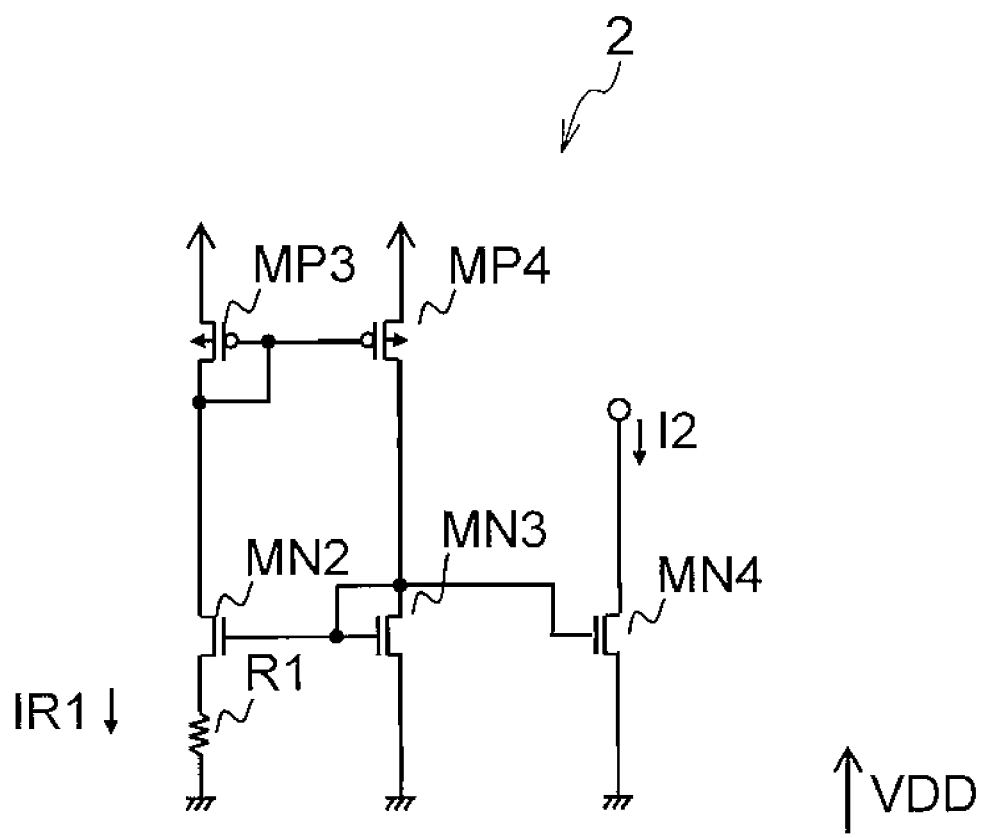
FIG. 3 is a circuit diagram illustrating another example of a configuration of a current source according to the first exemplary embodiment.
Figure 4:
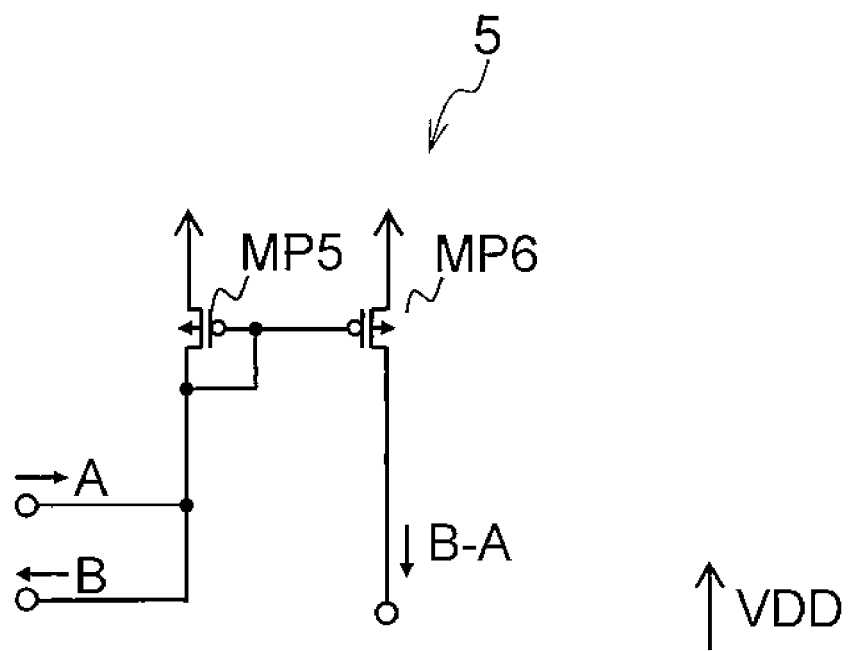
FIG. 4 is a circuit diagram illustrating an example of a configuration of a subtraction circuit according to the first exemplary embodiment.

Next, explanation follows regarding specific circuit configuration of the current sources 1, 2, and the subtraction circuit 5, with reference to FIG. 2 to FIG. 4. pd_n in FIG. 1 is a signal for starting up the current source 1 and the current source 2, and, for example, the current source 1 and the current source 2 start up when pd_n is H level (startup circuits are not illustrated in the drawings). The explanation of the present exemplary embodiment assumes that the current source 1 and the current source 2 have already been started up.

As illustrated in FIG. 2, the current source 1 is a self-bias circuit configured including P-channel MOS transistors MP0, MP1, MP2, N-channel MOS transistors MN0, MN1, and a resistor R0. In the following explanation, a P-channel MOS transistor MPi is sometimes referred to simply as the "MPi", and an N-channel MOS transistor MNj is sometimes referred to simply as the "MNj".

In the current source 1 according to the present exemplary embodiment, MP0 and MP1 have the same size dimensions as each other, and MN0 has a size that is a multiple of that of MN1. MP0 and MP1 configure a current mirror circuit sharing a gate-source voltage, and so an equivalent current flows in both MP0 and MP1. MN0 and MN1 share a gate voltage, and the source of MN0 is connected to the resistor R0, such that the gate-source voltage Vgs (MN0) of MN0 is smaller than the gate-source voltage Vgs (MN1) of MN1. The following Equation (1) is satisfied when the voltage across the resistor R0 is denoted V (R0).

$$V(R0)+Vgs(MN0)=Vgs(MN1) \quad (1)$$

The current that flows in MN0 is supplied from MP0, and the current that flows in MN1 is supplied from MP1. Since the current that flows in MP0 and the current that flows in MP1 are equivalent to each other, the current that flows in MN0 and the current that flows in MN1 are also equivalent to each other. A current IR0 flowing in the circuit is accordingly determined by the size of the resistor R0. The current IR0 flowing in the circuit is replicated by the current mirror circuit configured by MP0 and MP2, based on the ratio of MP0 and MP2, and output as a current I1.

As illustrated in FIG. 3, the current source 2 according to the present exemplary embodiment is a self-bias circuit configured including P-channel MOS transistors MP3, MP4, N-channel MOS transistors MN2, MN3, MN4, and a resistor R1. In terms of circuit configuration, the current source 2 is different from the current source 1 in that a current IR1 flowing in the circuit is determined by the resistor R1, and that the current I2 is drawn out by a current mirror circuit configured by MN3 and MN4.

In the current source 2 according to the present exemplary embodiment, the resistance value of the resistor R1 is set larger than the resistance value of the resistor R0 of the current source 1. Since the current IR1 is accordingly smaller than the current IR0, the current I2 is also smaller than the current I1, and the temperature dependency gradient of the current I2 is less than the temperature dependency gradient of the current I1 (see FIG. 5). The current source 1 and the current source 2 of the present exemplary embodiment moreover adopt circuits that generate what are referred to as a Proportional To Absolute Temperature (PTAT) currents exhibiting positive temperature dependency. Note that the temperature dependencies of the current source 1 and the current source 2 are not limited thereto, and circuits may be adopted that generate what are referred to as Complementary To Absolute Temperature (CTAT) currents exhibiting negative temperature dependency.

The trimming circuit 3 is a current mirror circuit that selectively draws current according to the trimming signal tc_trim<4:0>. The trimming circuits of the present exemplary embodiment are, for example, configured capable of using the trimming signal tc_trim<4:0> to select a current ratio of the current mirror circuit to replicate the input current (with 5 types set in the trimming circuits of the present exemplary embodiment), namely are configured capable of adjusting the size of the ratio of the output current to the input current.

More specifically, the trimming signal tc_trim<4:0> is a binary code, and is configured to give $2^N$ (N=5 in the present exemplary embodiment) weightings to output current A of m times the current I1. Note that the trimming signal tc_trim is not limited to five lines, and an appropriate number thereof may be provided according to the number of current ratios provided.

Similarly, the trimming circuit 4 is a current mirror circuit that selectively draws current according to the trimming signal sub_trim<4:0>. More specifically, the trimming signal sub_trim<4:0> is a binary code, and is configured to give $2^N$ (N=5 in the present exemplary embodiment) weightings to output current B of n times the current I2.

As illustrated in FIG. 4, the subtraction circuit 5 is a current mirror circuit configured including P-channel MOS transistors MP5 and MP6. The subtraction circuit 5 has a wired connection to the current A input from the trimming circuit 3, and to the current B input from the trimming circuit 4, and is configured to draw a current B-A from a current mirror. Note that in the present exemplary embodiment, explanation is given regarding an example in which the subtraction circuit 5 subtracts the current A from the current B; however there is no limitation thereto as long as the difference between the current A and the current B is derived, and configuration may be made in which the subtraction circuit 5 subtracts the current B from the current A.

As illustrated in FIG. 5, in the current generating circuit 50 according to the present exemplary embodiment, the output current I1 of the current source 1 and the output current I2 of the current source 2 have different positive gradients to each other. As illustrated in FIG. 6, the current I1 is multiplied by m by the trimming circuit 3, and the current I2 is multiplied by n by the trimming circuit 4, to adjust the gradient of the current A with respect to temperature and the gradient of the current B with respect to temperature to equivalent gradients. As a result, a current having a gradient with respect to temperature of substantially 0 can be obtained by subtracting current A=I1×m from current B=I2×n.

Moreover, in the current generating circuit 50 according to the present exemplary embodiment, the trimming circuit 6 multiplies the current B-A by k, to give a current C. The trimming circuit 6 is a current mirror circuit that selectively draws current according to the trimming signal trim<6:0>. The trimming signal trim<6:0> is a binary code, and is configured to give $2^N$ (N=5 in the present exemplary embodiment) weightings to output the current C of k times the current B-A.

The above configuration enables the current generating circuit 50 of the present exemplary embodiment to generate a current with low temperature dependency, and an oscillation frequency with low temperature dependency may be obtained by applying the current with low temperature dependency generated by employing the current generating circuit 50 in the clock generation circuit 9 of the oscillation circuit 100, of which explanation now follows.

Figure 7:
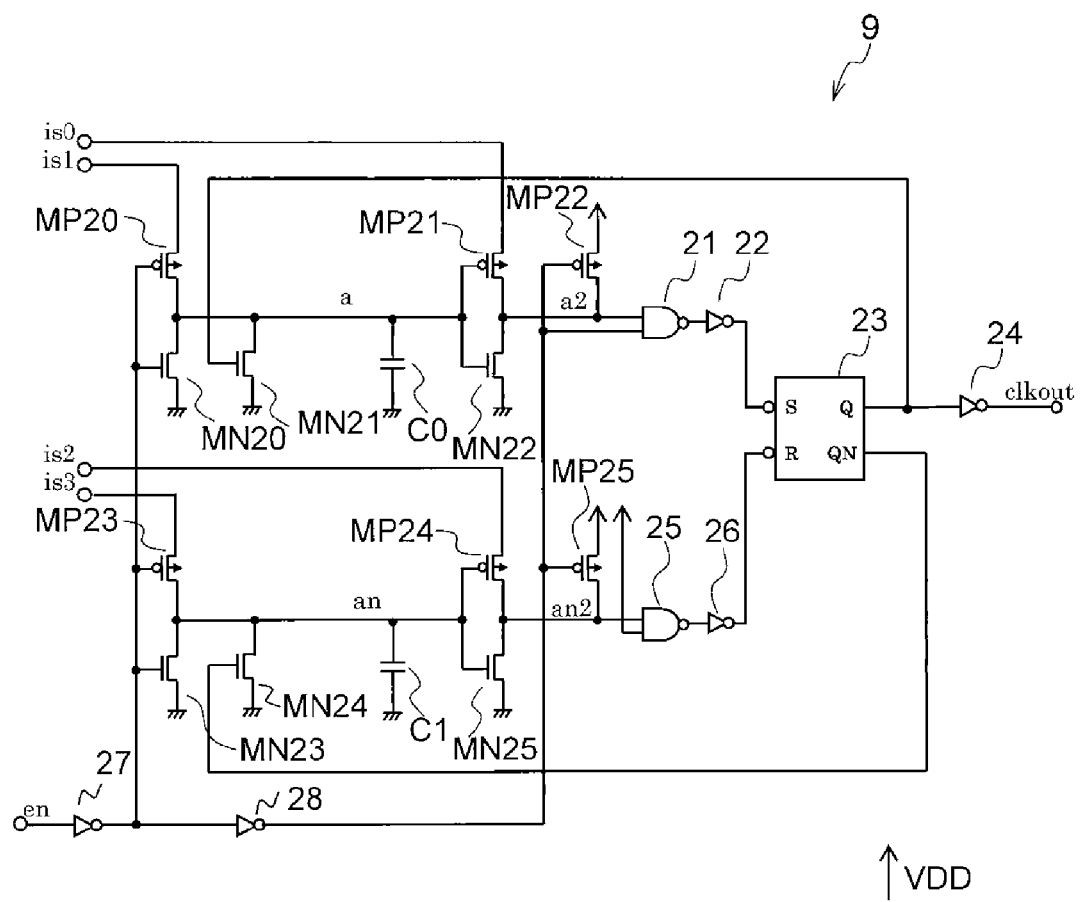
FIG. 7 is a circuit diagram illustrating an example a configuration of a clock generation circuit according to an exemplary embodiment.

Next, specific explanation follows regarding the clock generation circuit 9 of the oscillation circuit 100 according to the present exemplary embodiment, with reference to FIG. 7.

As illustrated in FIG. 7, the clock generation circuit 9 according to the present exemplary embodiment is configured including P-channel MOS transistors MP20 to MP25, N-channel MOS transistors MN20 to MN25, an SR latch 23, dual-input NANDs 21, 25, inverters 22, 24, 26 to 28, and capacitors C0, C1.

As illustrated in FIG. 7, the respective sources of MP21, MP20, MP24, and MP23 are connected to the trimming circuit 6, and supplied with respective currents is0, is1, is2, and is3 from the trimming circuit 6. Namely, in the present exemplary embodiment, the currents is0, is1, is2, and is3 have equivalent current values to each other and are the output current C of the trimming circuit 6.

The en signal is an enable signal, and the clock generation circuit 9 adopts an oscillating state when the en signal is H level, and adopts an oscillation stopped state when the en signal is L level.

First, when the en signal is L level, through the inverter 27 and the inverter 28, the output of the dual-input NAND 21 becomes H level, and the S input of the SR latch 23 through the inverter 22 therefore becomes L level. However, since the output of the dual-input NAND 25 becomes L level, the R input through the inverter 26 becomes H level. As a result, the Q output of the SR latch 23 becomes H level, and the clock signal clkout output through the inverter 24 becomes L level. Note that, the sources of MP22 and MP25 are connected to a power source voltage VDD, and the dual-input NANDs have one input level each determined according to the gate input.

The L level of the en signal is turned into an H level by the inverter 27, such that MN20 becomes ON, and a node a connected to the capacitor C0 becomes L level. Similarly, MN23 becomes ON, and so a node an connected to the capacitor C1 becomes L level.

Next, when the en signal becomes H level, the S input of the SR latch 23 becomes H level through the inverters 27, 28, the dual-input NAND 21, and the inverter 22, and so the Q output is held at H level. Moreover, since the gate potential becomes L level through the inverter 27, MN20 and MN23 are turned OFF, and MP20 and MP23 are turned ON.

When this occurs, MN21 is ON due to the Q output of the SR latch 23 being held at H level as described above, and so the node a remains at L level. However, since the QN output of the SR latch 23 is held at L level, MN24 connected to the node an is maintained in an OFF state, and MP24 is maintained in an ON state. Since MP23 connected to the node an is in an ON state, the capacitor C1 is charged by the current is3 (current C) flowing in through MP23, and the potential of the node an increases.

When the potential of the node an reaches a threshold value voltage of MN25, MN25 turns ON and a node an2 becomes L level. When this occurs, the R input of the SR latch 23 through the dual-input NAND 25 and the inverter 26 becomes L level, and so the QN output of the SR latch 23 becomes H level, and MN23 turns ON and the charge of the capacitor C1 is discharged. Since the Q output becomes L level, MN21 turns OFF, as a result of which the current is1 (current C) flows in through MP20, charging the capacitor C0. MN24 turns ON due to the H level QN output, and the node an is held at L level.

When the potential of the node a reaches a threshold value voltage of MN22 due to charging of the capacitor C0, MN22 turns ON and a node a2 becomes L level. When this occurs, the S input of the SR latch 23 through the dual-input NAND 21 and the inverter 22 becomes L level, and the Q output becomes H level, and so MN21 turns ON and the charge of the capacitor C0 is discharged. Moreover, since the QN output of the SR latch 23 becomes L level due to the S input becoming L level, MN24 turns OFF, and the current is3 (current C) flows in through MP23, charging the capacitor C1.

As described in detail above, in the clock generation circuit 9 according to the present exemplary embodiment, the capacitors C0 and C1 charge and discharge alternately due to the current C, thereby generating the clock signal clkout. Moreover, the oscillation circuit 100 according to the present exemplary embodiment may enable an oscillation frequency with low temperature dependency to be obtained, due to employing the current C that is a reference current with low temperature dependency as the reference current employed by the clock generation circuit 9.

Namely, the current generating circuit 50 according to the present exemplary embodiment includes the current source 1 that generates a PTAT current, the current source 2 that generates a current with a smaller current value than that of the current source 1, likewise, a PTAT current, the trimming circuit 3 that multiplies the output current I1 of the current source 1 by m, the trimming circuit 4 that multiplies the output current I2 of the current source 2 by n, and the subtraction circuit 5 that subtracts the output current B (=n×I2) of the trimming circuit 4 from the output current A (=m×I1) of the trimming circuit 3. The current ratio of the trimming circuit 3 and the trimming circuit 4 is adjusted and the temperature dependencies of current A and current B matched, and current A is subtracted from current B by the subtraction circuit 5, to enable generation of a current with low temperature dependency.

The oscillation circuit 100 according to the present exemplary embodiment adopts the clock generation circuit 9 in which a specific reference current alternately charges and discharges the two capacitors C0 and C1, to cause oscillation. The current C (=k×(B−A)) produced by the trimming circuit 6 multiplying the output current of the current generating circuit 50 by k is employed as the reference current, thereby enabling an oscillation frequency with low temperature dependency to be obtained. Note that the output current of the current generating circuit 50 employed by the oscillation circuit 100 according to the present exemplary embodiment need not necessarily be multiplied by k by the trimming circuit 6, and the output current B-A of the current generating circuit 50 may be employed as the reference current of the clock generation circuit 9 as it is.

In the oscillation circuit 100 according to the present exemplary embodiment, the size and temperature dependency of the charging currents of the capacitors C0 and C1 can be calibrated according to the temperature dependency of the oscillation frequency of the clock generation circuit 9. Accordingly, when, for example, the oscillation circuit 100 is used to form a semiconductor device, even when variation in the oscillation frequency of the clock generation circuit 9 arises between semiconductor chips due to variation in elements configuring the clock generation circuit 9, adjusting the size and temperature dependency of the charging currents enables the oscillation frequency of the clock signal clkout output from the clock generation circuit 9 to be calibrated to a target frequency, thereby enabling an oscillation frequency with low temperature dependency to be obtained.

It is possible to configure the current generating circuit 50 and the oscillation circuit 100 according to the present exemplary embodiment without employing operational amplifiers, thereby enabling a reduction in the number of elements, and also enabling operation at a low voltage power source voltage of approximately 1.4V, as well as enabling minute transistors to be employed, thereby enabling a smaller layout surface area.

In the clock generation circuit 9 employed in the oscillation circuit 100 according to the present exemplary embodiment, the inverter configured by MP21 and MN22, and the inverter configured by MP24 and MN25 are respectively connected to the two capacitors C0, C1 that charge and discharge alternately. The inverter configured by MP21 and MN22 is connected to the current source is0 (current C) serving as a current supply source instead of the power source voltage VDD, and the inverter configured by MP24 and MN25 is connected to the current source is2 (current C) serving as a current supply source instead of the power source voltage VDD.

The voltages across the two capacitors C0, C1 are therefore controlled by the inverters that are operated by the current C current source that is the reference current. Namely, configuration is made such that charging and discharging of the capacitors C0, C1 is operated at the threshold values of the NMOS transistors MN22, MN25 of the inverters, thereby enabling a reduction in the dependency of the oscillation frequency on the power source voltage.

[Second Exemplary Embodiment]

Figure 8:
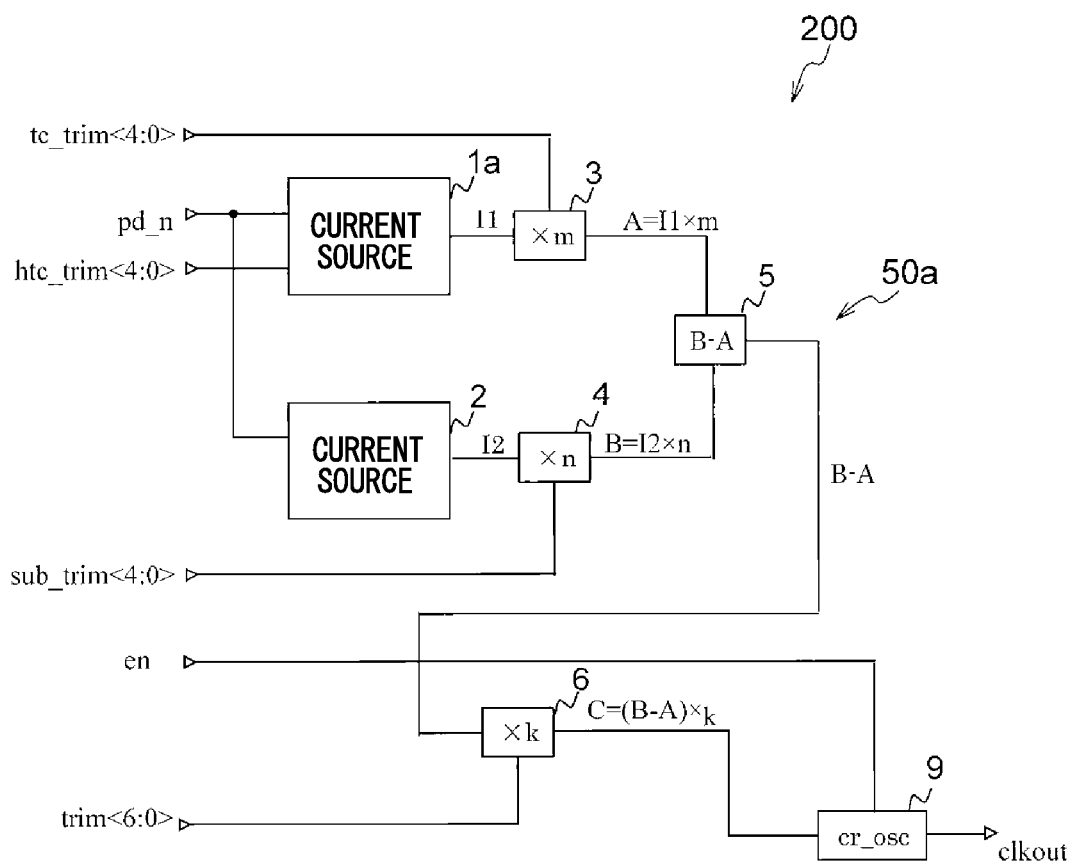
FIG. 8 is a functional block diagram illustrating an example of a functional configuration of an oscillation circuit according to the second exemplary embodiment.
Figure 9:
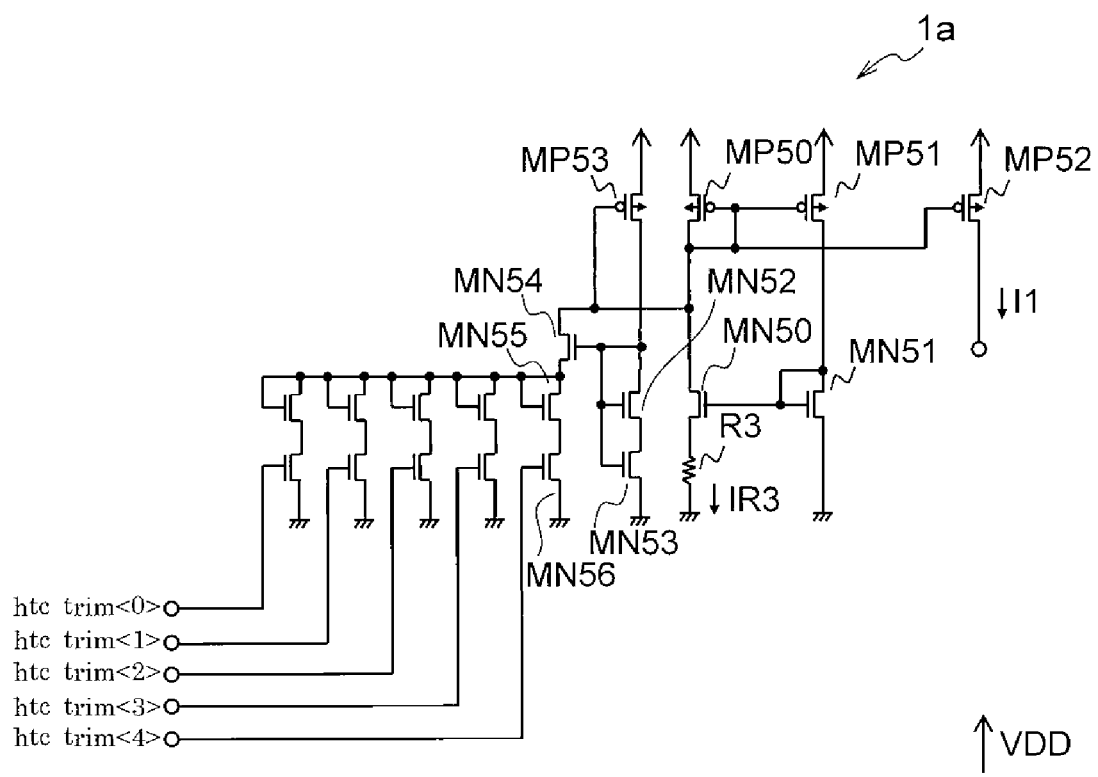
FIG. 9 is a circuit diagram illustrating an example of a configuration of a current source according to the second exemplary embodiment.

Explanation follows regarding an oscillation circuit 200 according to the present exemplary embodiment, with reference to FIG. 8 and FIG. 9. As illustrated in FIG. 8, the oscillation circuit 200 is the oscillation circuit 100 illustrated in FIG. 1, in which the current source 1 has been exchanged for a current source 1a, and the current generating circuit 50 has been exchanged for a current generating circuit 50a. Accordingly, equivalent configurations are applied with the same reference numerals, and explanation thereof is omitted.

In the current source 2 illustrated in FIG. 3, a leak current component increases exponentially when elements thereof reach a temperature of, for example, 100° C. or greater, and the leak component remains even when the difference to the current source 1 is taken, with the issue that the charging current of the capacitors C0, C1 increases at high temperatures, increasing the oscillation frequency. The current generating circuit 50a and the oscillation circuit 200 according to the present exemplary embodiment address this issue.

FIG. 9 is a circuit diagram of the current source 1a according to the present exemplary embodiment. In FIG. 9, P-channel MOS transistors MP50, MP51, MP52, N-channel MOS transistors MN50, MN51, and a resistor R3 respectively correspond to the P-channel MOS transistors MP0, MP1, MP2, the N-channel MOS transistors MN0, MN1, and the resistor R0 of the current source 1 illustrated in FIG. 2. The current source 1a is accordingly a circuit in which a P-channel MOS transistor MP53, and N-channel MOS transistors MN52, MN53, MN54, MN55, and MN56 are connected to the current source 1. Note that the reference numerals of N-channel MOS transistors corresponding to MN55, MN56 connected to htc_trim<0> to htc_trim<3> are omitted.

As illustrated in FIG. 9, MN52 and MN53 are connected with cascode connections to MP53 that is a current source, and the source of MN53 is connected to GND. The common gate of MN52 and MN53 is connected to the drain of MN52 and the gate of MN54. The drain of MN54 is connected to the drain of MN50, and the source of MN54 is connected to the drain of MN55, the gate of MN55 is connected its own drain, the source of MN55 is connected to the drain of MN56, the source of MN56 is connected to GND, and the gate of MN56 is connected to a trimming signal htc_trim<4>. The transistors corresponding to MN55 and MN56 are also connected to trimming signals htc_trim<0> to htc_trim<3>.

Note that MN52 and MN53 have a cascode connection, and have common gates, such that the a drain voltage Vd (MN52) of MN52 is the sum of a gate-to-source voltage Vgs (MN52) of MN52, and a drain-source voltage Vds (MN53) of MN53. Namely, Equation (2) below is satisfied.

$$Vd(MN52) = Vgs(MN52) + Vds(MN53) \tag{2}$$

When the gate input htc_trim<4> of MN56 is H level, in particular, when the gate voltage of MN56 is sufficiently high due to the H level, the drain-to-source voltage of MN56 is small enough to be considered 0V. Moreover, the gate voltage of MN54 is equivalent to the Vd (MN52) described above, and so the gate-to-source voltage Vgs (MN54) of MN54 can be expressed by Equation (3) below, when the gate-to-source voltage of MN55 is denoted Vgs (MN55).

$$\begin{aligned}Vgs(MN54) &= Vd(MN52) - Vgs(MN55) \\ &= Vgs(MN52) + Vds(MN53) - Vgs(MN55)\end{aligned} \tag{3}$$

Note that if the substrate bias effect of MN52 is ignored, Vgs (MN52) and Vgs (MN55) may be considered substantially equivalent to each other, thereby satisfying Equation (4) below.

$$Vgs(MN54) \approx Vds(MN53) \tag{4}$$

Namely, a voltage is reached that is a fraction of the threshold value voltage of MN55, and MN54 operates in a sub-threshold region. Current that increases exponentially at high temperatures can accordingly flow into MN54.

As a result, in the current source 1a illustrated in FIG. 9, when a semiconductor device configuring the oscillation circuit 200 reaches a high temperature of, for example, 100° C. or greater, the leak current component flows through MN54, enabling an increase in the leak current component flowing in MP51, MN51. Due to this configuration, the current flowing in MP50 becomes a current to which the leak current component at high temperature has been added to a current IR3, and by drawing this added current as a replicated current I1, adjustment can be made such that a current B-A that is the difference at high temperature, namely, the current charging and discharging the capacitors C0, C1, does not increase, thereby obtaining the advantageous effect of enabling fluctuation in the oscillation frequency to be suppressed.

[Third Exemplary Embodiment]

Figure 10:
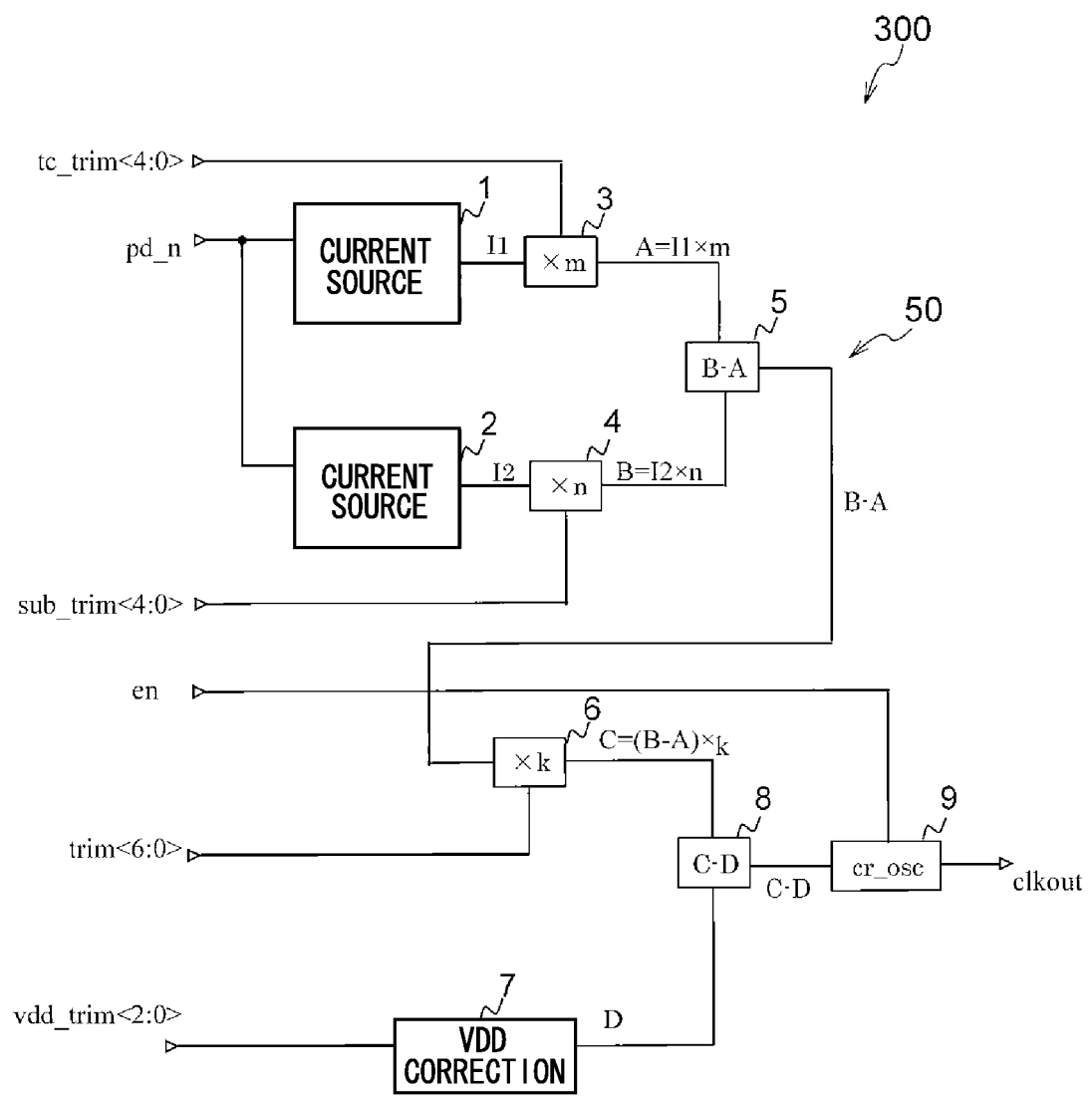
FIG. 10 is a functional block diagram illustrating an example of a functional configuration of an oscillation circuit according to a third exemplary embodiment.
Figure 11:
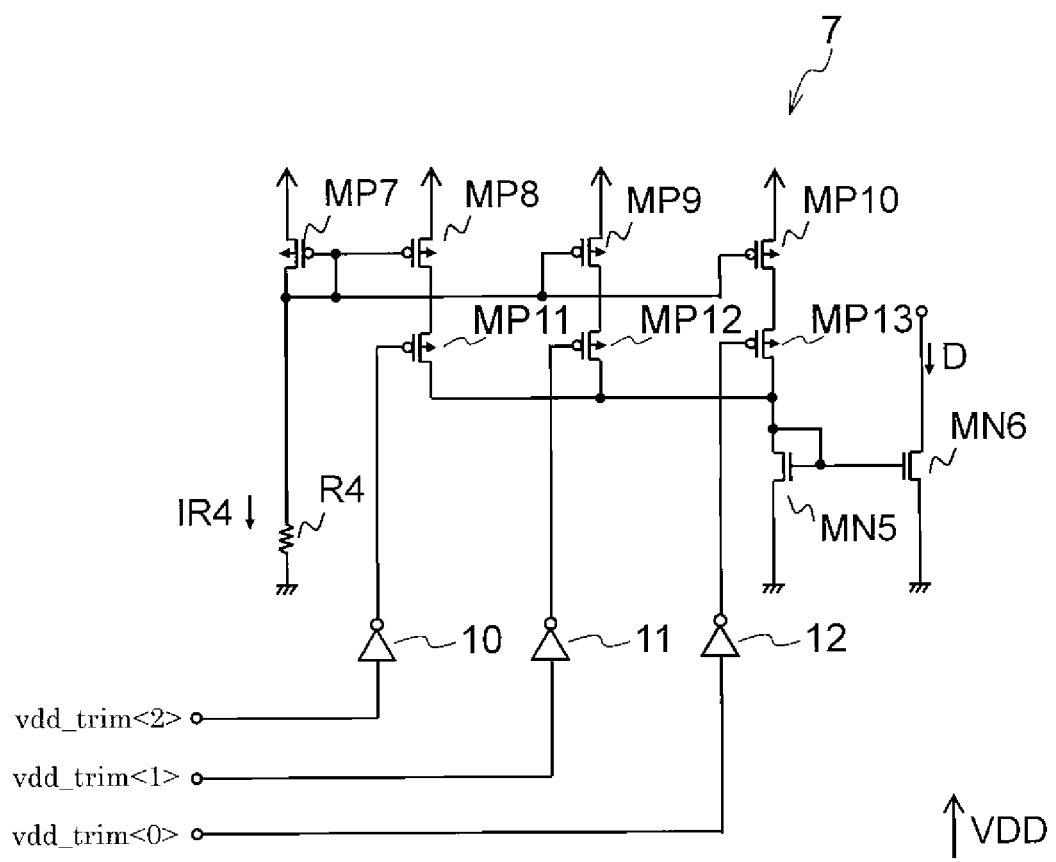
FIG. 11 is a circuit diagram illustrating an example of a configuration of a VDD correction circuit according to the third exemplary embodiment.

Explanation follows regarding an oscillation circuit 300 according to the present exemplary embodiment, with reference to FIG. 10 and FIG. 11.

As illustrated in FIG. 10, the oscillation circuit 300 is the oscillation circuit 100 illustrated in FIG. 1, with an additional VDD correction circuit 7 and subtraction circuit 8. The oscillation circuit 300 is intended to improve oscillation frequency temperature dependency, and improve power source voltage dependency by addition of the VDD correction circuit 7 and the subtraction circuit 8 to the oscillation circuit 100.

Explanation follows regarding specific circuit configuration of the VDD correction circuit 7, with reference to FIG. 11. The VDD correction circuit 7 includes a current source through which flows a reference current for correcting the power source voltage (VDD) dependency of the oscillation frequency, and a trimming circuit that trims the current of the current source. Namely, the VDD correction circuit 7 generates a reference current dependent on the power source voltage VDD, and selects a replicated current based on the reference current using a trimming signal vdd_trim<2:0>, and generates an output current D that is dependent on the power source voltage VDD. The subtraction circuit 8 generates a current C-D in which the current D has been subtracted from the output current C of the trimming circuit 6.

As illustrated in FIG. 11, P-channel MOS transistors MP7, MP8, MP9, and MP10 configure a current mirror circuit, and a current IR4 flowing in a resistor R4 is replicated based on size ratios of the MP7 to the MP8, MP9, and MP10 respectively. MP11, MP12, and MP13 are switches that switch the respective MP8, MP9, and MP10 ON and OFF, and gates of these switches are respectively connected the trimming signals vdd_trim<2>, vdd_trim<1>, and vdd_trim<0> via respective inverters 10, 11 and 12. Namely, the mirror ratio with respect to the current IR4 is selected by the trimming signal vdd_trim<2:0>, and thereby output as the current D.

Note that, the current IR4 that flows in the resistor R4 increases if the power source voltage VDD gets higher, and decreases if the power source voltage VDD gets lower, such that fluctuations in the power source voltage VDD are detected by the current IR4 in the oscillation circuit 300 according to the present exemplary embodiment. The current D drawn out by N-channel MOS transistors MN5 and MN6 fluctuates according to the power source voltage VDD is accordingly generated based on the current IR4 that fluctuates according to fluctuations of the power source voltage VDD.

Next, the subtraction circuit 8 that is configured similarly to the subtraction circuit 5 illustrated in FIG. 4 generates the current C-D in which the current D has been subtracted from the current C, and the current C-D is supplied to the clock generation circuit 9. Namely, in the clock generation circuit 9 of the oscillation circuit 300 according to the present exemplary embodiment, the current C-D is supplied as the currents is0 to is3 illustrated in FIG. 7. The current C-D, in which the fluctuation component has been subtracted from the current C including a fluctuation component due to fluctuation of the power source voltage VDD, is accordingly supplied to the clock generation circuit 9. Note that in the present exemplary embodiment, explanation is given regarding the example of the subtraction circuit 8 that subtracts the current D from the current C; however there is no limitation thereto as long as the difference between the current C and the current D is derived, and configuration may be made in which the subtraction circuit 5 subtracts the current C from the current D.

As described above, the oscillation circuit 300 according to the present exemplary embodiment includes the VDD correction circuit 7 that generates the output current D including a fluctuation component due to the power source voltage VDD based on a current that detects power source fluctuations of the power source voltage VDD, and the subtraction circuit 8 that configures the current C-D in which the current D is subtracted from the current C including the fluctuation component due to the power source voltage VDD. The capacitors C0, C1 of the clock generation circuit 9 are charged and discharged using the current C-D in which the dependency on the power source voltage VDD has been suppressed, thereby correcting and reducing the power source voltage dependency of the oscillation frequency. Accordingly the oscillation circuit 300 according to the present exemplary embodiment enables the advantageous effects of reducing temperature dependency of the oscillation circuit 100, as well as reducing power source voltage dependency of the oscillation frequency.

Note that in each of the exemplary embodiments described above, and as illustrated in FIG. 2, FIG. 3, and FIG. 9, explanation has been given regarding examples of configuration in which self-bias circuits are employed for the current source 1, the current source 2, and the current source 1a. However, there is no limitation thereto, and for example, configuration may be made employing band gap circuits or the like.

Moreover in each of the exemplary embodiments described above, explanation has been given regarding examples in which the clock generation circuit 9 oscillates by alternately charging and discharging two capacitors. However, there is no limitation thereto, and for example, configuration may be made employing a CR oscillation circuit, or a ring oscillator.

What is claimed is:

1. An oscillation circuit comprising:
a first current source having a dependency of current value on temperature exhibiting a first characteristic;
a second current source having a dependency of current value on temperature exhibiting a second characteristic;
a first conversion section that is input with a current from the first current source and configured to output a first current including a specific characteristic which is converted from the first characteristic;
a second conversion section that is input with a current from the second current source and configured to output a second current including the specific characteristic which is converted from the second characteristic;
a subtraction section that is input with the first current and the second current and a difference current that is a difference between the first current and the second current; and
a clock generation section configured to generate a clock signal by alternately charging and discharging a first capacitor and a second capacitor based on the difference current,
wherein the first characteristic and the second characteristic are represented by respective linear functions, both of the linear functions having a gradient in a same direction.

2. The oscillation circuit of claim 1, wherein:
the first characteristic is expressed by a linear function from among the respective linear functions having a first gradient;
the second characteristic is expressed by a linear function from among the respective linear functions having a second gradient; and
the first gradient and the second gradient are positive.

3. The oscillation circuit of claim 1, wherein the first conversion section and the second conversion section are each current mirror circuits configured as including:
a constant current circuit;
a plurality of replication circuits configured to replicate a current of the constant current circuit at different ratios; and
a switch, connected to each of the plurality of replication circuits, configured to switch the replication circuits between conduction and non-conduction.

4. The oscillation circuit of claim 1, wherein the subtraction section is a current mirror circuit configured as including:
a constant current circuit configured by wired connection of a signal line in which the first current flows and a signal line in which the second current flows; and
a replication circuit configured to replicate a current flowing in the constant current circuit.

5. The oscillation circuit of claim 1, wherein the clock generation section comprises:
a first inverter circuit that is configured by a P-channel MOS transistor and an N-channel MOS transistor connected together in a complementary manner to let the difference current flow through, and that has an output connected to the first capacitor; and
a second inverter circuit that is configured by a P-channel MOS transistor and an N-channel MOS transistor connected together in a complementary manner to let the difference current flow through, and that has an output connected to the second capacitor.

6. The oscillation circuit of claim 1, wherein the clock generation section comprises:
a first inverter circuit that is configured by a P-channel MOS transistor and an N-channel MOS transistor connected together in a complementary manner to let the difference current flow through, and that has an input connected to the first capacitor; and
a second inverter circuit that is configured by a P-channel MOS transistor and an N-channel MOS transistor connected together in a complementary manner to let the difference current flow through, and that has an input connected to the second capacitor.

7. The oscillation circuit of claim 1, wherein at least one of the first current source or the second current source is a current mirror circuit configured as including:
a constant current circuit;
a current correction circuit configured to generate a current corresponding to a leak current arising in the constant current circuit at high temperature, and add the generated current corresponding to the leak current to a current of the constant current circuit; and
a replication circuit configured to replicate the added current at a specific ratio.

8. The oscillation circuit of claim 7, wherein the current correction circuit is configured to operate an MOS transistor in a sub-threshold region to generate the current corresponding to the leak current, and add the generated current corresponding to the leak current to the current of the constant current circuit.

9. The oscillation circuit of claim 1, further comprising:
a detection section configured to detect power source voltage fluctuation and output a detection result as a detection current; and
a second subtraction section that is input with the difference current and the detection current, and configured to output a current of a difference between the difference current and the detection current,
wherein the clock generation section is configured to generate the clock signal by alternately charging and discharging the first capacitor and the second capacitor based on the current of the difference between the difference current and the detection current.

10. A current generation circuit comprising:
a first current source having a dependency of current value on temperature exhibiting a first characteristic;
a second current source having a dependency of current value on temperature exhibiting a second characteristic;
a first conversion section that is input with a current from the first current source and configured to output a first current having a specific characteristic which is converted from the first characteristic;
a second conversion section that is input with a current from the second current source and configured to output a second current having the specific characteristic which is converted from the second characteristic; and
a subtraction section that is input with the first current and the second current and configured to output a difference current that is a difference between the first current and the second current,
wherein the first characteristic and the second characteristic are represented by respective linear functions, both of the linear functions having a gradient in a same direction.

11. An oscillation method comprising:
inputting to a first conversion section a current from a first current source having a dependency of current value on temperature exhibiting a first characteristic, and outputting from the first conversion section a first current having a specific characteristic that has been converted from the first characteristic;
inputting to a second conversion section a current from a second current source having a dependency of current value on temperature exhibiting a second characteristic, and outputting from the second conversion section a second current having the specific characteristic that has been converted from the second characteristic;
inputting the first current and the second current to a subtraction section and outputting from the subtraction section a difference current that is a difference between the first current and the second current; and
generating a clock signal by alternately charging and discharging a first capacitor and a second capacitor based on the difference current,
wherein the first characteristic and the second characteristic are represented by respective linear functions, both of the linear functions having a gradient in a same direction.

12. The oscillation circuit of claim 1, wherein the gradient of the second characteristic is smaller than the gradient of the first characteristic, and the current value of the second current source is smaller than the current value of the first current source.

13. The oscillation circuit of claim 1, wherein the first conversion section is configured to convert the first characteristic such that dependency of current value on temperature of the first current exhibits the specific characteristic, and the second conversion section is configured to convert the second characteristic such that dependency of current value on temperature of the second current exhibits the specific characteristic, and the specific characteristics can be represented by respective linear functions having a same gradient and a same direction.

14. The oscillation circuit of claim 1, wherein the subtraction section is configured to output the difference current obtained from the difference between the first current and the second current that each has the specific characteristic, and the specific characteristics are represented by respective linear functions having a same gradient and a same direction.

* * * * *